United States Patent [19]

Heinz et al.

[11] Patent Number: 4,762,869

[45] Date of Patent: Aug. 9, 1988

[54] HIGH TEMPERATURE RESISTANT MOLDING MATERIALS

[75] Inventors: Gerhard Heinz, Weisenheim; Hermann Buchert, Bad Durkheim; Juergen Koch, Neuhofen; Georg N. Simon, Limburgerhof; Peter Ittemann, Ludwigshafen; Hartmut Zeiner, Plankstadt, all of Fed. Rep. of Germany

[73] Assignee: BASF Aktiengesellschaft, Rheinland-Pfalz, Fed. Rep. of Germany

[21] Appl. No.: 38,896

[22] Filed: Apr. 16, 1987

[30] Foreign Application Priority Data

Apr. 30, 1986 [DE] Fed. Rep. of Germany ....... 3614594

[51] Int. Cl.$^4$ .............................................. C08L 95/00
[52] U.S. Cl. ...................................... 524/59; 524/611; 524/413; 524/431; 524/420; 524/423; 524/444; 524/418; 524/425; 524/404; 524/492; 525/537; 525/534; 525/535; 528/99; 528/391; 528/104; 528/171; 528/174; 528/218; 528/219
[58] Field of Search ............... 528/391, 99, 104, 171, 528/174, 218, 219; 525/537, 535, 534; 524/59, 611, 431, 413, 420, 423, 444, 418, 425, 404, 492

[56] References Cited

U.S. PATENT DOCUMENTS 4,020,046 4/1977 King et al. .................. 528/174
4,654,410 3/1987 Kashiwame et al. ............ 525/534

*Primary Examiner*—Melvyn I. Marquis
*Attorney, Agent, or Firm*—Oblon, Fisher, Spivak, McClelland & Maier

[57] ABSTRACT

High temperature resistant molding materials containing (A) 5-95 mol % of blocks having the structural unit I

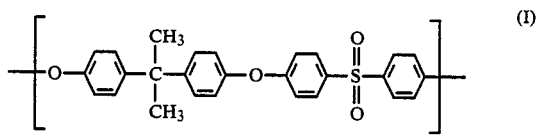

(B) 5-95 mol % of blocks having the structural unit II

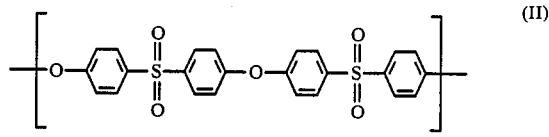

(C) 0-80 mol % of blocks having the structural unit III

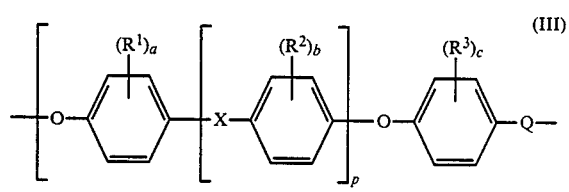

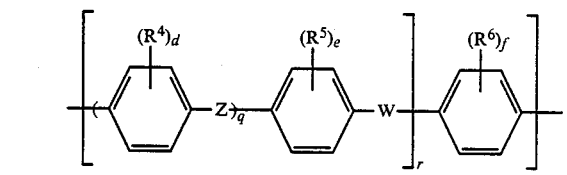

the molecular weight of the blocks being within the range 2000-20,000, where X is —O—, —S—,

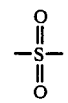

(only if a or b≠0),

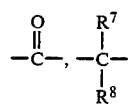

($R^7=R^8=CH_3$ only if a or b≠0) or a chemical bond, $R^7$ and $R^8$ are each alkoxy or alkyl of 1-6 carbon atoms, aryl or hydrogen, Q and W are each

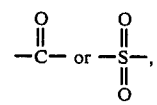

Z is —O— or a chemical bond and $R^1$, $R^2$, $R^3$, $R^4$, $R^5$ and $R^6$ are each alkyl or alkoxy of 1-6 carbon atoms, aryl, Cl or F and p, q and r are each 0 or 1 and a, b, c, d and e are each 0, 1, 2, 3 or 4.

17 Claims, No Drawings

HIGH TEMPERATURE RESISTANT MOLDING MATERIALS

The present invention relates to high temperature resistant molding materials containing (A) 5-95 mol % of blocks having the structural unit I

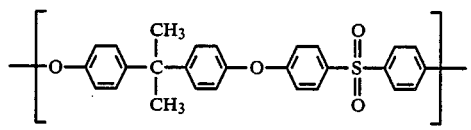

(B) 5-95 mol % of blocks having the structural unit II

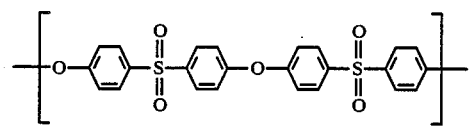

(C) 0-80 mol % of blocks having the structural unit III

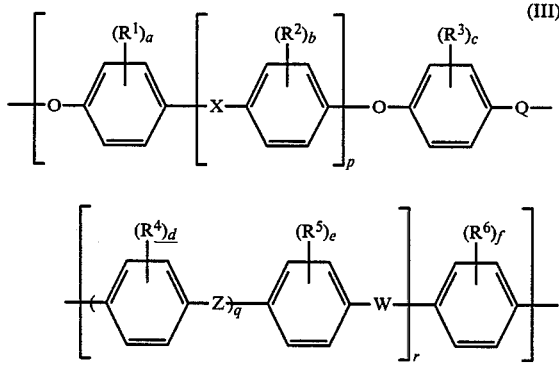

the molecular weight of the blocks being within the range 2000-20,000, where X is —O—, —S—,

(only if a or b≠0),

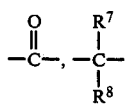

($R^7=R^8=CH_3$ only if a or b≠0) or a chemical bond, $R^7$ and $R^8$ are each alkoxy or alkyl of 1-6 carbon atoms, aryl or hydrogen, Q and W are each

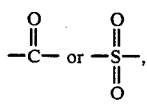

Z is —O— or a chemical bond and $R^1$, $R^2$, $R^3$, $R^4$, $R^5$ and $R^6$ are each alkyl or alkoxy of 1-6 carbon atoms, aryl, Cl or F and p, q and r are each 0 or 1 and a, b, c, d and e are each 0, 1, 2, 3 or 4.

The present invention also relates to the use of the molding materials according to the invention for producing circuit boards and electrical plug-in connections.

Polyether sulfones having the general structural unit (frequently, as hereinafter, simply referred to as polysulfones)

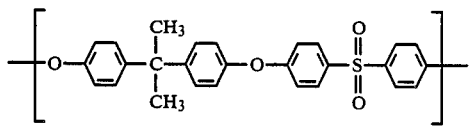

have a very low water uptake and hence a very small distortion tendency (of the moldings prepared therefrom). However, the heat distortion resistance (determined in terms of the maximum sustained use temperature) is not sufficient for some applications, in particular in the case of the printed circuit boards (PCBs) produced from the molding materials.

Polyether sulfones having the general structural unit

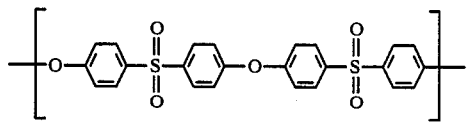

have a better heat distortion resistance than polysulfones, but the water uptake is significantly higher. As a consequence, moldings from polyether sulfones have an unsatisfactory dimensional stability and, for example, are easily swelled and distorted, which is not acceptable for use in electrical engineering and electronics (for example for printed circuit boards).

Mixtures of polysulfones and polyether sulfones exhibit a linear relationship between mixing ratio and water uptake, but the heat distortion resistance is adversely affected by the polysulfone content. In addition, moldings from such mixtures are no longer transparent as a consequence of the incompatibility of the two components, which constitutes a significant disadvantage.

U.S. Pat. No. 4,175,175, EP-A-113,112 and EP-A-195,130 describe random copolycondensates which are obtainable by polycondensation of mixtures of 2,2-di(4-hydroxyphenyl)propane (bisphenol A) and 4,4'-dihydroxydiphenyl sulfone (bisphenol S) with 4,4'-dichlorodiphenyl sulfone (DCDPS).

It is an object of the present invention to provide high temperature resistant copolycondensates having a balanced spectrum of properties, ie. sufficient heat distortion resistance coupled with low water uptake and high stress cracking resistance, which are suitable in particular for producing printed circuit boards and electrical plug-in connections.

We have found that this object is achieved with high temperature resistant molding materials as claimed in claim 1.

Preferred copolycondensates of this type can be found in the subclaims and the following detailed description.

Blocks of the general structure I are derived from the condensation of bisphenol A (2,2-di(4'-hydroxyphenyl)-propane) with 4,4'-dichlorodiphenyl sulfone or the corresponding fluorine compound, and blocks of the general structure II from the condensation of bisphenol S (4,4'-dihydroxydiphenyl sulfone) with these dihalogen compounds.

Blocks of structure III are derived from the condensation of dihydroxy compounds of the general formula IV

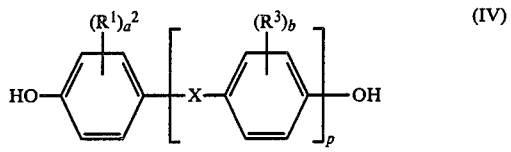

and dihalogen compounds of the general formula V

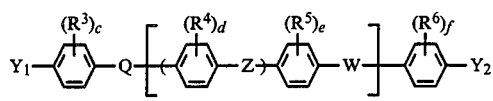

where $R^1$, $R^2$, $R^3$, $R^4$, $R^5$, $R^6$, a, b, c, d, e, f, X, Q, Z and W have the meanings given in claim 1 and $Y_1$ and $Y_2$ are each Cl or F.

Preferably $R^1$ and $R^2$ are alkyl of 1–4 carbon atoms, for example methyl, ethyl, i- or n-propyl, i-, n- or t-butyl, or corresponding alkoxy or aryl.

It is to be noted that if

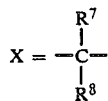

$R^7$ and $R^8$ can only both be a methyl group if at least one substituent $R^1$ or $R^2$ is present, ie. if either a and/or b≠0. Preferably a and b are each 0, 1 or 2.

p can be 0 or 1, ie. the dihydroxy compound can contain one or two phenyl rings.

There now follows a representative list of some preferred dihydroxy compounds of the general formula IV

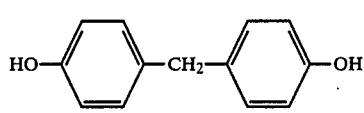

di(4-hydroxyphenyl)methane

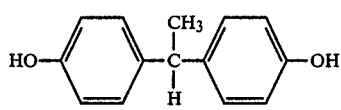

2,2-di(4-hydroxyphenyl)ethane

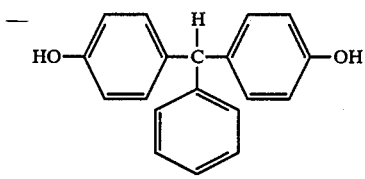

1-phenyl-1,1-di(4-hydroxyphenyl)methane

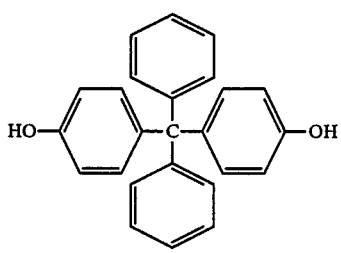

diphenyldi(4-hydroxyphenyl)methane

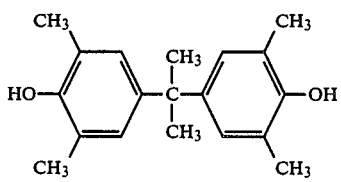

tetramethylbisphenol A

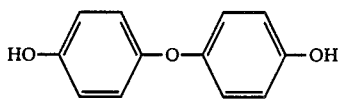

4,4'-dihydroxydiphenyl ether

| | |
|---|---|
| 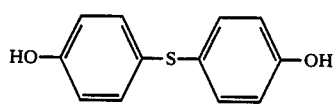 | 4,4'-dihydroxydiphenyl sulfide |
| 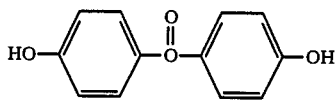 | dihydroxybenzophenone |
| 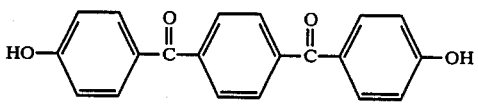 | 1,4-di(4'-hydroxycarbonyl)phenyl)benzene |
| 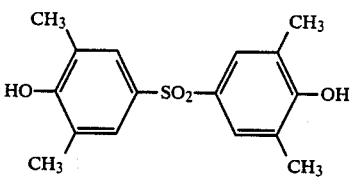 | tetramethylbisphenol S |
| 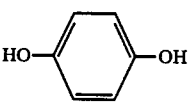 | hydroquinone |
| 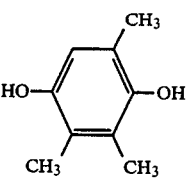 | 2,3,6-trimethylhydroquinone |
| 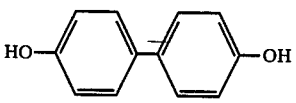 | 4,4'-dihydroxydiphenyl |
| 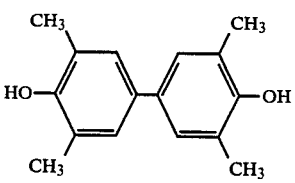 | 3,3',5,5'-tetramethyldihydroxydiphenyl |
| 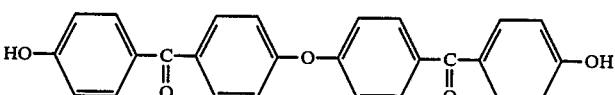 | dihydroxybenzophenyl ether |

Of the dihydroxy compounds listed above, particular preference is given to 4,4'-dihydroxydiphenyl, 3,3',5,5'-tetramethyl-4,4'-dihydroxydiphenyl, tetramethylbisphenol A and 2,3,6-trimethylhydroquinone.

In the dihalogen compounds of the abovementioned general formula, the substituents $R^3$, $R^4$, $R^5$ and $R^6$ are each preferably alkyl of 1–4 carbon atoms, for example methyl, i- or n-propyl, or t-butyl, or Cl or F.

The following dihalogen compounds of the general formula V may be listed representatively as preferred examples.

| | Name of chlorine compound |
|---|---|
| 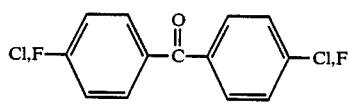 | 4,4'-dichlorobenzophenone |

| | Name of chlorine compound |
|---|---|
| Cl,F—⟨⟩—C(O)—⟨⟩—C(O)—⟨⟩—Cl,F | 1,4-di(4'-chlorocarbonylphenyl)benzene |
| Cl,F—⟨⟩—S(O)₂—⟨⟩—⟨⟩—S(O)₂—⟨⟩—Cl,F | 1,10-di(4'-chlorophenylsulfonyl)diphenyl |
| (CH₃)₂-Cl,F—⟨⟩—S(O)₂—⟨⟩—Cl,F-(CH₃)₂ | 3,3',5,5'-tetramethyl-4,4'-dichlorodiphenyl sulfone |
| Cl,F—⟨⟩(Cl)—S(O)₂—⟨⟩—Cl,F | 3'-chloro-4,4'-dichlorodiphenyl sulfone |
| Cl,F—⟨⟩(Cl)—S(O)₂—⟨⟩(Cl)—Cl,F | 3,3',4,4'-tetrachlorodiphenyl sulfone |
| Cl,F—⟨⟩—S(O)₂—⟨⟩(CH₃,CH₃)—S(O)₂—⟨⟩—Cl,F | 1,3-dimethyl-4,6-di(4'-chlorophenylsulfonyl)benzene |

Of the dihalogen compounds listed above, particular preference is given to 3,3',5,5'-tetramethyl-4,4'-dichlorodiphenyl sulfone, 1,10-di(4'-chlorophenylsulfonyl)diphenyl and 1,3-dimethyl-4,6-di(4'chlorophenylsulfonyl)benzene.

The proportion of blocks A of structure I is 5–95, preferably 20–80, and in particular 40–60 mol %, based on the total amount of blocks A, B and C. This also applies to the molar proportion of blocks B of the general structure II.

The proportion of blocks C of the structure III is 0–80, preferably 0–60, in particular 5–50 mol %. The range 10–40 mol % is very particularly preferred.

The molecular weight of blocks A, B and C ranges from 2000 to 20,000, in particular from 2000 to 15,000, particularly preferably from 4000 to 12,000.

The total molecular weight of the block copolycondensates ranges from 15,000 to 200,000, preferably from 15,000 to 100,000 and in particular from 20,000 to 50,000.

All the abovementioned molecular weights are weight averages as defined for example in E. Vollmert, Grundriss der Makromolekularen Chemie, volume 3, pages 122 et seq. (1979).

The copolycondensates can be mixed with other thermoplastics, for example polyesters, polyamides, polyurethanes, polyolefins, polyvinyl chloride and polyoxymethylenes, in amounts of from 5 to 60% by weight, preferably from 20 to 50% by weight, based on the molding materials.

They can also be modified with reinforcing fillers, transparent or opacifying pigments and other assistants and additives.

Suitable reinforcing fillers are for example asbestos, coal or preferably glass fibers, glass fibers being used for example in the form of glass fabrics, mats, sheets and/or preferably glass rovings or chopped glass filaments made of low-alkali E-glasses and having a diameter of from 5 to 20 μm, preferably from 8 to 50 μm, and having, after incorporation, an average length of from 0.05 to 1 mm, preferably from 0.1 to 0.5 mm. The molding materials reinforced with glass roving or chopped glass filament contain from 10 to 60% by weight, preferably from 20 to 50% by weight, of the reinforcing agent, based on the total weight, while the impregnated glass fibers, mats and/or sheets contain from 10 to 80% by weight, preferably from 30 to 60% by weight, of copolycondensate, based on the total weight. Suitable pigments are for example titanium dioxide, cadmium sulfide, zinc sulfide, barium sulfate and carbon black. Other additives and assistants can be for example dyes, lubricants, for example graphite or molybdenum disulfide, abrasives, for example carborundum, light stabilizers and hydrolysis inhibitors. Even wollastonite, calcium carbonate, glass balls, quartz powder, sulfur and boron nitride or mixtures thereof can be used. The pigments, additives and assistants are customarily used in amounts of from 0.01 to 3% by weight, based on the weight of copolycondensate.

The molding materials according to the invention can be prepared in a conventional manner like block copolymers, as described in the literature. In general, the blocks A, B and C can be prepared separately and be subsequently linked to one another, or, alternatively, the block copolycondensates are synthesized in one operation by appropriate successive separate addition of the dihydroxy compounds.

The process conditions, such as temperature, pressure, solvents and possible additions (catalysts) are the same as described for random copolycondensates in EP-A-113,112 and EP-A-135,130, so that details are superfluous here.

It is particularly suitable to carry out the reaction in an aprotic polar solvent in the presence of an anhydrous alkali metal carbonate as catalyst. A particularly preferred combination is N-methylpyrrolidone as solvent and $K_2CO_3$ as catalyst.

After the polycondensation it is possible, for the purposes of obtaining stabilization, to react free phenolate end groups with an arylating or alkylating agent, for example methyl chloride. This is preferably done at 50°-200° C., preferably 50°-150° C.

The suspended alkali metal halide obtained if the polycondensation is carried out with $K_2CO_3$ as catalyst can be separated off by means of a suitable separating device, for example a clarifying filter or a centrifuge.

The copolycondensates can be isolated from the solution by evaporating the solvent or by precipitation in a suitable nonsolvent.

the total amount of monomers in stage I) was heated to 170° C. in twice the amount by weight of a mixture of N-methylpyrrolidone and chlorobenzene (weight ratio 3:1) with stirring and passing in of nitrogen. The resulting water of reaction was removed for 4 h by means of a water separator. This was followed by further condensation at 190° C. for 4 h.

Stage II:

After addition of the monomers for stage II indicated in the Table, of potassium carbonate (again in 10% molar excess, based on the total amount of monomers of stage II) and of 1.5 times the amount by weight (based on the total amount of monomers in stage II) of N-methylpyrrolidone, the reaction mixture was heated at 170° C. for 2 h, and subsequently the reaction was continued at 190° C. for 6 h. By passing in methyl chloride for 30 minutes the polycondensation was terminated.

Water was added to precipitate the polymer, which was then repeatedly washed with water to remove inorganic constituents and was dried at 80° C. under reduced pressure.

The results of the measurement of the maximum sustained use temperature (heat distortion resistance Tg) and of the water uptake after 180 days can be found in the Table, where, furthermore, the following abbreviations are used:

DCDPS=4,4'-dichlorodiphenyl sulfone
bis A=2,2-di(4'-hydroxyphenyl)propane (bisphenol A)
DHDPS=4,4'-dihydroxydiphenyl sulfone
$M_{PSU}$=molecular weight of polysulfone blocks (weight average)
Tg=maximum sustained use temperature, in °C.

TABLE

| Example No. | DCDPS g (mol) | Bis A g (mol) | DHDPS g (mol) | DCDPS g (mol) | $M_{PSU}$ | Tg °C. | Viscosity number DIN 53 726/8 | Water uptake (180 days) Standard[1] atmosphere % by weight | $H_2O$ % by weight |
|---|---|---|---|---|---|---|---|---|---|
| | Stage I | | Stage II | | | | | | |
| 1 | 248.70 (0.866) | 204.09 (0.894) | 33.79 (0.1350) | 29.87 (0.104) | 15000 | 195 | 65 | 0.10 | 0.69 |
| 2 | 272.25 (0.948) | 237.42 (1.04) | 236.56 (0.945) | 305.56 (1.064) | 4000 | 211 | 68 | 0.13 | 1.06 |
| 3 | 276.84 (0.964) | 231.03 (1.01) | 241.3 (0.964) | 304.4 (1.06) | 9000 | 207 | 85 | 0.14 | 1.04 |
| 4 | 277.9 (0.968) | 227.4 (0.996) | 242.3 (0.968) | 305.6 (1.064) | 15000 | 204 | 71 | 0.13 | 1.05 |
| 5 | 236.64 (0.824) | 193.59 (0.848) | 280.30 (1.12) | 346.91 (1.21) | 15000 | 216 | 69 | 0.17 | 1.25 |
| 6 | 290.6 (1.01) | 226.9 (0.964) | 265.3 (1.06) | 276.8 (0.96) | 9000 | 208 | 79 | 0.15 | 1.05 |
| | Stage II | | Stage I | | | | | | |
| 7 | 277.9 (0.968) | 227.4 (0.996) | 242.3 (0.968) | 305.6 (1.064) | 15000 | 206 | 70 | 0.14 | 1.05 |

[1]Standard atmosphere: 23° C., 50% relative humidity

The molding materials according to the invention have balanced properties. They combine high heat distortion resistance and high stress cracking resistance with low water uptake and very good processing properties.

The molding materials according to the invention can be used for producing moldings, films and fibers. In particular, owing to their good properties, they are suitable for producing circuit boards and electrical plug-in connections.

EXAMPLES 1-7

Stage I:

A mixture of dichlorodiphenyl sulfone, bisphenol A (in the amounts indicated in the Table), and potassium carbonate (the latter in a 10% molar excess, based on

We claim:

1. A high temperature resistant molding material, comprising:

(A) 5-95 mol% of blocks having the structural unit I

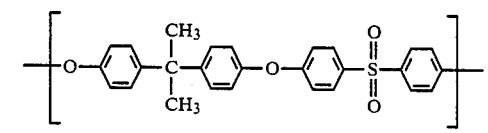

(B) 5–95 mol% of blocks having the structural unit II

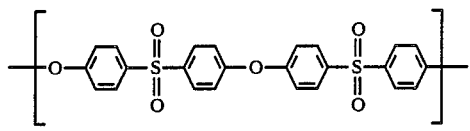

(C) 0–80 mol% of blocks having the structural unit III

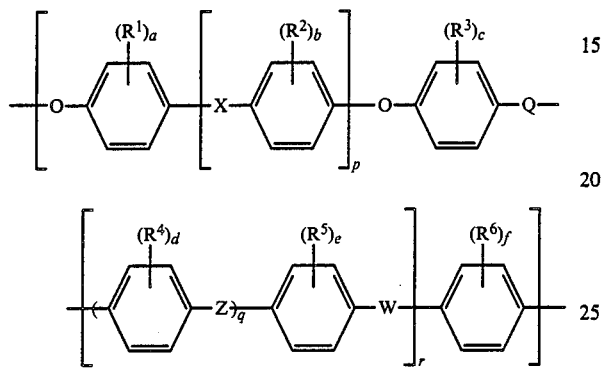

wherein:
the weight average molecular weight of each of the blocks is within the range of 2,000 to 20,000;
X is —O—, —S, —SO$_2$—, —CO—, —CR$^7$R$^8$— or a chemical bond, wherein R$^7$ and R$^8$ are each independently a C$_{1-6}$ alkoxy group, a C$_{1-6}$ alkyl group, an aryl group or a hydrogen atom;
Q and W are each independently —CO— or —SO$_2$—;
Z is —O— or a chemical bond;
R$^1$, R$^2$, R$^3$, R$^4$, R$^5$ and R$^6$ are each independently a C$_{1-6}$ alkyl group, a C$_{1-6}$ alkoxy group, an aryl group, a chlorine atom or a fluorine atom;
p, q and r are each independently 0 or 1; and
a, b, c, d and e are each independently 0, 1, 2, 3 or 4 with the proviso that not both a and b are zero if X is —SO$_2$— or if R$^7$ and R$^8$ are both —CH$_3$.

2. The high temperature resistant molding material of claim 1, comprising:
(A) 20–80 mol% of blocks of structural unit I;
(B) 20–80 mol% of blocks of structural unit II;
(C) 0–50 mol% of blocks of structural unit III.

3. The high temperature resistant molding material of claim 1, wherein the amount of blocks (C) is in the range of from 5 to 50 mol%.

4. The high temperature resistant molding material of claim 1, comprising from 10 to 60 percent by weight, based on the total weight, of at least one reinforcing filler.

5. The high temperature resistant molding material of claim 2, comprising from 10 to 60 percent by weight, based on the total weight, of at least one reinforcing filler.

6. The high temperature resistant molding material as defined in claim 2, comprising from 20 to 60 percent by weight, based on the total weight, of at least one reinforcing filler.

7. The high temperature resistant molding material of claim 1, comprising from 20 to 50 percent by weight, based on the molding materials, of at least one thermoplastic polymer selected from the group consisting of polyesters, polyamides, polyolefins, polyurethanes, polyvinylchloride and polyoxymethylenes.

8. The high temperatures resistant molding material of claim 3, comprising from 20 to 50 percent by weight, based on the molding materials, of at least one thermoplastic polymer selected from the group consisting of polyesters, polyamides, polyolefins,. polyurethanes, polyvinylchloride and polyoxymethylenes.

9. The high temperature resistant molding material of claim 4, comprising from 20 to 50 percent by weight, based on the molding materials, of at least one thermoplastic polymer selected from the group consisting of polyesters, polyamides, polyolefins, polyurethanes, polyvinylchloride and polyoxymethylenes.

10. The high temperature resistant molding material of claim 6, comprising from 20 to 50 percent by weight, based on the molding materials, of at least one thermoplastic polymer selected from the group consisting of polyesters, polyamides, polyolefins, polyurethanes, polyvinylchloride and polyoxymethylenes.

11. A molding obtained from a high temperature resistant molding material comprising:
(A) 5–95 mol% of blocks having the structural unit I

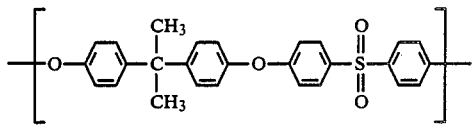

(B) 5–95 mol% of blocks having the structural unit II

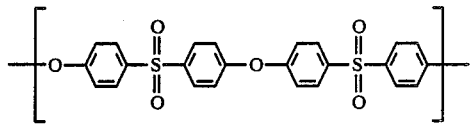

(C) 0–80 mol% of blocks having the structural unit III

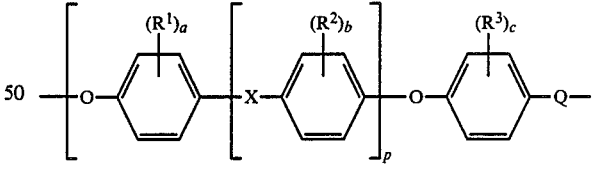
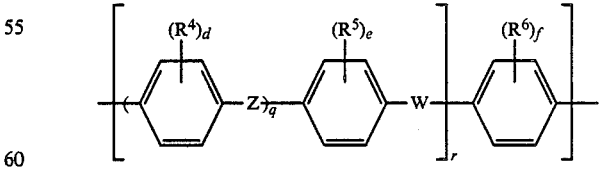

wherein:
the weight average molecular weight of each of the blocks is within the range of 2,000 to 20,000;
X is —O—, —S, —SO$_2$—, —CO—, —CR$^7$R$^8$— or a chemical bond, wherein R$^7$ and R$^8$ are each independently a C$_{1-6}$ alkoxy group, a C$_{1-6}$ alkyl group, an aryl group or a hydrogen atom;

Q and W are each independently —CO— or —SO$_2$—;

Z is —O— or a chemical bond;

$R^1$, $R^2$, $R^3$, $R^4$, $R^5$ and $R^6$ are each independently a C$_{1-6}$ alkyl group, a C$_{1-6}$ alkoxy group, an aryl group, a chlorine atom or a fluorine atom;

p, q and r are each independently 0 or 1; and a, b, c, d and e are each independently 0, 1, 2, 3 or 4 with the proviso that not both a and b are zero if X is —SO$_2$— or if $R^7$ and $R^8$ are both —CH$_3$, as an essential component.

12. The molding of claim 11, wherein said molding is a circuit board.

13. The molding of claim 11, wherein said molding is an electrical plug-in connection.

14. The high temperature resistant molding material of claim 1, wherein $R^3$, $R^4$, $R^5$ and $R^6$ are each independently a C$_{1-4}$ alkyl group, a chlorine atom or a fluorine atom.

15. The high temperature resistant molding material of claim 1, wherein $R^3$, $R^4$, $R^5$ and $R^6$ are each independently methyl, iso-propyl, n-propyl or tert-butyl.

16. The high temperature resistant molding material of claim 4, wherein said reinforcing filler comprises asbestos, coal, or glass fiber.

17. The high temperature resistant molding material of claim 16, wherein said glass fiber is a glass fabric, a glass mat, a glass sheet, a glass roving or chopped glass filament.

* * * * *